United States Patent [19]

Fertin

[11] 3,928,864

[45] Dec. 23, 1975

[54] LINEAR DISPLAY DEVICE

[75] Inventor: Jacques Fertin, Caen, France

[73] Assignee: U.S. Philips Corporation, New York, N.Y.

[22] Filed: Dec. 18, 1973

[21] Appl. No.: 425,725

[30] Foreign Application Priority Data

Dec. 19, 1972 France .............................. 72.45209

[52] U.S. Cl. ....................... 357/17; 357/18; 357/23; 357/52; 307/304

[51] Int. Cl. ............................................ H01l 14/11

[58] Field of Search..... 317/235 N, 235 B; 307/311, 307/304; 357/17, 18, 23, 52

[56] References Cited

UNITED STATES PATENTS 3,492,548 1/1970 Goodman ........................... 317/235

3,558,897 1/1971 May .................................... 250/209

*Primary Examiner*—Martin H. Edlow
*Attorney, Agent, or Firm*—Frank R. Trifari; Jack Oisher

[57] ABSTRACT

A solid-state display device or indicator producing a luminous column is described. The device includes an elongated semiconductor electro-luminescent diode, an insulator on the surface, and a resistance layer on the insulator. The diode junction is forward biased to produce a luminous column. The voltage to be indicated is applied to the resistance layer to establish a gradient therein which tends to move carriers in the semiconductor from an area of radiative bulk recombination to an area of non-radiative recombination, thereby reducing or extinguishing the column end in relation to the magnitude of the applied voltage.

13 Claims, 7 Drawing Figures

LINEAR DISPLAY DEVICE

The present invention relates to a monolithic device comprising a semiconductor body of a first conductivity type on which extends a region of the opposite conductivity type which forms a junction with the said body and shows electroluminescent properties when minority charge carriers are injected into it, the said body and the said region comprising electrodes which permit of connecting them to a source of electrical energy, a dielectric layer extending parallel to the junction across the said region and being covered itself with a conductive layer.

For the display by means of light of numerical information, mosaics of electroluminescent diodes are conventionally used. These diodes which are grouped in alphanumerical figures or are placed according to an XY matrix, require very complicated and hence expensive coding and decoding circuits for their control. It seems desirable to have available a device which enables an analog display, for example, a device which provides information on the value of a quantity by means of a luminous surface of which a dimension varies proportionally with said value.

Electroluminescent devices are known the light emission of which can be localized, for example, the device which forms the subject matter of French patent application No. 72.25492. This device comprises a semiconductor body on which a semiconductor region extends which forms a junction with the body and shows electroluminescent properties when minority charge carriers are injected into it. A dielectric layer extends parallel to the junction across the said region and is covered itself, over certain parts of its surface, with a polarized conductive layer under a voltage which can be adjusted relative to the said region in such manner that in said layer below the dielectric layer local zones of electric fields can be localized which influence injected carriers in the parts which correspond to said region. In accordance with the polarization of the parts of the conductive layer, the injected charge carriers move towards the surface or back to the junction and give rise to recombinations which are non-radiative in the first case and are radiative in the second case.

It would be possible to realize a linear display stepwise by means of such devices by aligning a certain number of parts of the conductive layer the polarization voltages of which would be modulated in a corresponding manner or aligning a certain number of elementary devices. However, a quantification of the value to be displayed by discrete values, is then necessary and requires an analog-to-digital converter.

It is the object of the present invention to mitigate this drawback. Another object of the invention is to provide a device for the linear display of information regarding an electrical quantity. Another object of the invention is to provide an electroluminescent monolithic semiconductor device of which at least one dimension of the luminous surface is a function of a value of an electrical quantity.

The invention uses the effect of repulsion or attraction of the charge carriers by an electric field which is caused via a dielectric which is used in a localized manner in the device described in the above-stated patent application.

According to the invention, the device comprises an electroluminescent diode having a first region of a first conductivity type, a second region of the opposite conductivity type extending on the first region and showing electroluminescent properties when charge carriers are injected into it, the said regions comprising electrodes which are connected to an electric energy source, a thin insulating layer extending across the said second region parallel to the junction between the two regions, and a resistance layer extending on the said insulating layer, and is characterized in that the said resistance layer and the said insulating layer are transparent to the radiation emitted from the said first region and the said resistance layer has an elongated shape, and the device comprises means to apply, at one end of the said resistance layer, a potential difference relative to the said second region and to apply a potential gradient in the direction of the other end of the said resistance layer.

An elongated shape is to be understood to mean herein a shape of which the average ratio length/width is high, for example, equal to or larger than 10, the ends of said shape being considered to lie along an imaginary line the largest dimension. The insulating layer acts as a dielectric. The resistance of the resistance layer and the surface resistance of the second region determine the gradient of the electric field in the surface part of the second region.

When the diode is polarized in the forward direction, minority charge carriers are injected into the second region and eventually recombine which, in order to be radiative, must take place in the bulk and not at the surface.

The potential difference between the first end of the resistance layer and the second region creates an electric field in the part of the latter which is present below said end, and an electric field which decreases towards the underlying part at the other end is established below the insulating layer along the second region. For a certain gradient, the field at any point is a function of the potential difference and, with a given potential difference and a given gradient, the field at any point is a function of the distance from said point to the first end of the resistance layer.

An electric field in the second region causes a movement towards the surface of the minority charge carriers or a movement towards the junction of the same charge carriers in accordance with the direction of said field and said movement becomes the more prominent according as the voltage which causes same is higher. With a substantially uniform injection of charge carriers throughout the junction, the movement towards the surface of the charge carriers or towards the junction of the same carriers makes itself felt in any point of the second region as a function of the position of the point and as a function of the applied voltage.

In the case of a movement towards the surface over a particular length of the second region, the recombinations take place mainly at the surface by the field effect which attracts the minority charge carriers towards the surface and the recombinations are not radiative or at least less radiative than over the remaining length of the said region.

With a constant and uniform injection, a more luminous part and a less luminous part appears of which the complementary lengths are a function of the voltage applied to the first end of the resistance layer. Thus, a display device is available which causes a luminous surface to appear the length of which is a function of the voltage applied in a point. The device constitutes an indicator having a luminous column.

The device is simple, does not require the quantification of an electric quantity of which the quantity is to be displayed. The device can be manufactured by means of the methods known from semiconductor technology.

The invention will be described in greater detail with reference to the accompanying drawings, in which.

In order to obtain the potential difference between one end of the resistance layer and the second region, and in order to obtain a potential gradient in the desired direction, various means are to be considered.

Figure 1:
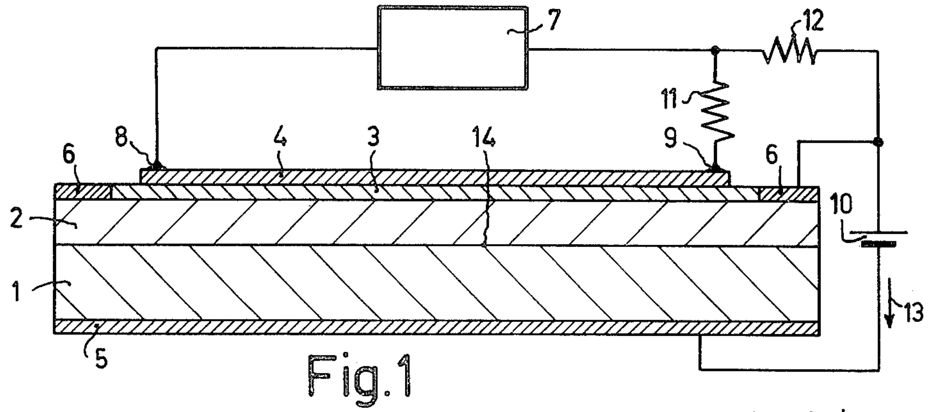
FIG. 1 is a diagrammatic longitudinal cross-sectional view of a first embodiment of the device according to the invention.

In a first embodiment illustrated in FIG. 1, the voltage to be displayed or a certain fraction of said voltage is applied between the two ends of the resistance layer by means of non-rectifying contacts and one end is set up at the potential of the second region by means of an electric connection. The insulating layer acts as a dielectric in which the minimum thickness thereof is determined by the applied voltage. The resistance of the resistance layer between the two ends determines the voltage gradient and thus the gradient of the electric field in the second region.

The device shown in FIG. 1 comprises an elongated plate of semiconductor material having electroluminescent properties and comprising a first region 1, for example of the n-conductivity type, and a second region 2 of the opposite conductivity type, said two regions having a flat junction 14 and the surface of the region 2 being parallel to said junction. A dielectric layer 3 extends on the region 2 and leaves around it an annular surface which is sufficient for a metal deposit 6 which is destined for connection contacts. On the layer 3 extends a resistance layer 4 at the ends of which contacts 8 and 9 are provided.

A constant-current generator 10 is connected between the metal surface 6 and a metal deposit 5 which is provided on the free face of the region 1. The direction of the connection makes it possible to convey the current 13 in the forward direction of the diode 1, 2.

A voltage $V_1$ is applied by a source 7 between the end contacts 8 and 9, a resistor 11 being interconnected, if desired, so as to adapt the voltage of the source 7. The contacts 9 and 6 are connected, possibly with the interconnection of a resistor 12 which enables the voltage $V_1$ to be displaced relative to the potential of the region 2.

The layer 4 and the layer 3 the configuration and the shape of each approach each other very closely have, for example, a rectangular shape and a length which is at least equal to 10 times the width, the length being considered as being parallel to the plane of the drawing.

Figure 2:
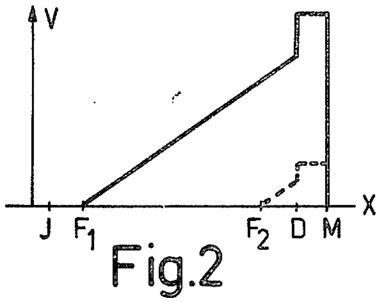
FIG. 2 is a diagram of the value of the electric field in the direction of thickness of a device.

At any point of the layer 4 present between 8 and 9 the applied voltage corresponds to a certain depth of the field zone, which depth is shown in FIG. 2 which shows a diagram of the value of the field as a function of the thickness X perpendicularly to the surface of the layer 3.

Near the contact 8 where the voltage is highest, the field is strong in the layer 3 between the interface with the resistance layer 4 at M up to the interface with the semiconductor at D. At the interface D the field falls to a lower value and then reduces linearly with the thickness of the semiconductor which is considered to be homogeneous to a value zero at depth $F_1$ which lies near the junction J. Near the contact 9 where the voltage is lowest, the field is weak and penetrates only to the depth $F_2$. Between the points 8 and 9 the depth of the field zone varies in a continuous manner.

Figure 3:
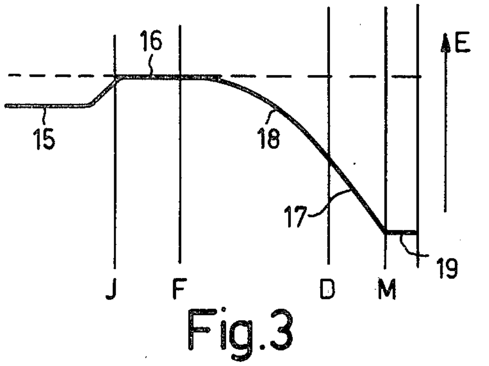
FIG. 3 is a diagram of energy levels of charge carriers in the direction of thickness of a device.

FIG. 3 is a diagram of energy levels in the device in the case in which the voltage $V_1$ is positive relative to the point 6 as a function of the thickness perpendicularly to the surface of the layer 3. In the region 1 the level of the conduction band of the material is at 15, at the junction the level passes to 16 in the same manner as in a known electroluminescent diode polarised in the forward direction. If the voltage $V_1$ in the layer 3 is positive relative to point 6, the level follows an exponential curve 18 which is prolonged by the curve 17 in the dielectric 3 and by the straight line 19 in the resistance material of the layer 4.

According to the polarity and the value of the voltage $V_1$, the injected minority charge carriers, being electrons in the case in which the region 2 is of the p-type, are attracted or repelled by the applied electric field which varies the recombination possibilities with the minority charge carriers at the surface or in the bulk. A high positive voltage $V_1$ increases the possibility of recombination at the surface where said recombinations tend to be non-radiative. The effect of the voltage makes itself felt over a more or less long distance, taken from point 8, in accordance with the value of the voltage $V_1$. When $V_1$ increases, the effect makes itself felt over a larger length. Said device displays a value of the applied voltage, the light column caused by the electroluminescence of the region 2 has a luminous part which is shorter according as the applied voltage $V_1$ is higher.

The variation of the length of the best illuminated column part as a function of the applied voltage may be linear or follow a previously wanted relation or rule. The shape of the resistance layer 4 is adjusted to obtain the wanted relation. The plan view of FIG. 4, for example, shows a device which is analogous to that shown in FIG. 1 in which the layer 4 has a symmetrical shape with curved edges 20.

Figure 4:
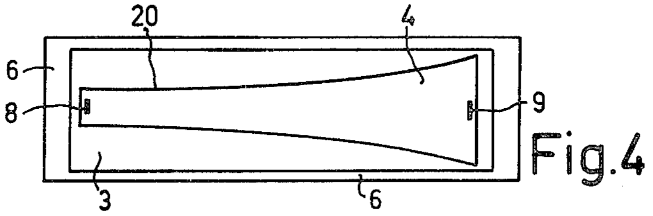
FIG. 4 is a diagrammatic plan view of a device which is analogous to that shown in FIG. 1.

In order to give the device a better luminous column aspect it may be desirable to hide the surfaces of the layer and of the region 2 which are present outside the electric field which is caused by the voltage $V_1$ and which can thus be permanently illuminated. A mask which exposes only the central part of the layer 4 along the longitudinal axis is placed on the device especially in the case of a layer of a special shape as shown in FIG. 4. In a second embodiment illustrated in FIG. 5, the voltage to be displayed or a certain part of said voltage is applied between one end of the resistance layer where a non-rectifying contact is provided and the second region and the resistance of the resistance layer taken between the two ends is significantly higher than the resistance in the direction of the thickness of the insulating layer. The resistance layer and the insulating layer constitute component resistors as a result of which a potential gradient is established along the resistance layer. The material and the thickness of the insulating layer, and the material and the thickness of the resistance layer have been chosen to be so that a sufficient ratio is obtained between the two above-stated resistors in the longitudinal and in the transverse directions. Said ratio preferably is at least equal to 10 in order to obtain a sufficient variation of the potential throughout the length of the layer.

Figure 5:
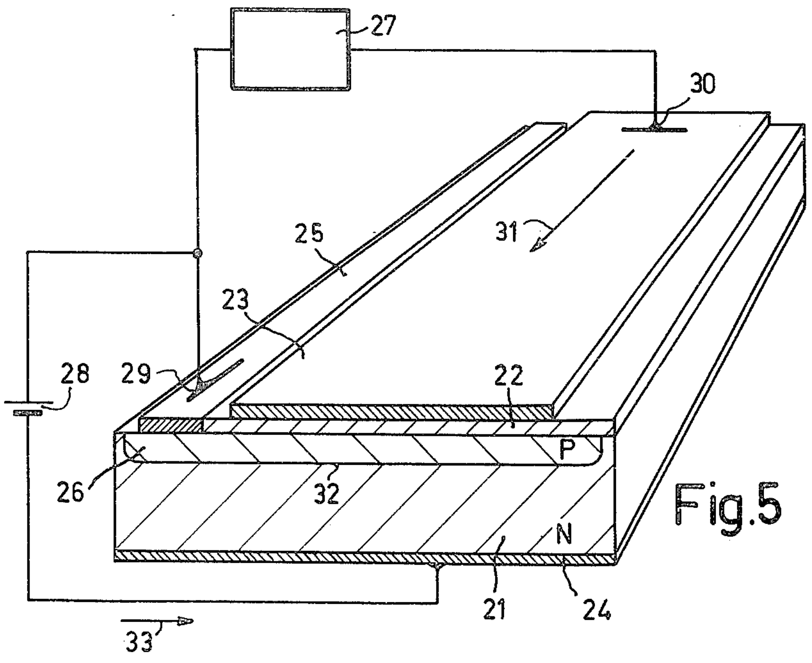
FIG. 5 is a diagrammatic perspective view of another embodiment of a device according to the invention.

The device shown in FIG. 5 consists of a plate whose length is large with respect to its width and which has been manufactured from an electroluminescent semiconductor material. This plate comprises a first region 21 of n-conductivity type and a second region 26 obtained by diffusion of an impurity which gives the p-conductivity type and which forms a junction 32. A metal deposit 24 on the lower surface of the region 21 makes it possible to connect said region to a terminal of an electric energy source 28. The upper surface of the plate is covered with a thin insulating layer 22 which leaves sufficient area of the region 26 free to provide a contact via a metal deposit 25 extending throughout the length of the plate and being connected at 29 to the other terminal of the electric energy source 28. The surface of the insulating layer 22 is covered with a resistance layer 23 extending throughout the length of the plate, the length being takin in the direction of the arrow 31. The resistance layer 23 is provided at one of the ends thereof with a connection contact 30. The voltage $V_2$ of the generator 27 which is to produce light emission along a part of the length of the plate is applied between 29 and 30.

The electric source 28 is connected in the forward direction of the junction 32 and provides a constant current 33. The charge carriers injected via the junction 32 give rise to recombinations in the region 26. The voltage $V_2$ which is applied between one end of the resistance layer 23 and the whole length of the region 26 divides over the whole length of the layer 22, the resistance of said layer in the direction of the thickness being smaller than the resistance of the layer 23 in the length direction. The distribution of the voltage determines an electric field gradient in the region 26. Over a certain length the field is sufficient to influence the injected carriers and to reduce to a considerable extent, for example, the possibilities of radiation recombinations in the bulk in the case in which the voltage $V_2$ is positive on the side of the terminal 30.

In a third embodiment illustrated in FIG. 6, the voltage to be displayed or part of said voltage is applied between one end of the resistance layer where a non-rectifying contact is provided and the part of the second region which is present below the other end of said layer, on which part a non-rectifying contact is provided.

Figure 6:
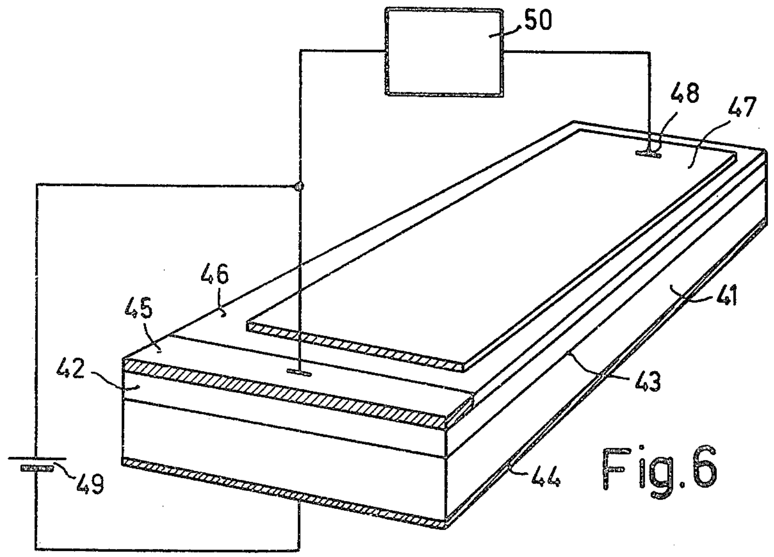
FIG. 6 is a diagrammatic perspective view of a third embodiment of a device according to the invention.

As shown in FIG. 6, the device is constituted by an electroluminescent diode having two regions 41 and 42, a junction 43, a contact 44 over the lower surface of the region 41, a contact 45 at one end of the region 42, an insulating layer 46, and a resistance layer 47 at one end of which a contact 48 is provided. The contacts 45 and 48 are present on oppositely located ends. A constant current is supplied by the energy source 49 in the forward direction of the diode. A voltage supplied by the generator 50 is applied between the contacts 45 and 48. This voltage distributes between the two contacts as a function of the length resistance of the layer 47, of the thickness resistance of the layer 46 and of the length resistance of the region 42. The electric field which influences the possibility of radiation recombinations in the said region 42 thus shows a gradient in the longitudinal direction which is a function of said voltage distribution.

In a fourth embodiment illustrated in FIG. 7, the voltage to be displayed or a certain part of said voltage is applied between one end of the resistance layer where a non-rectifying contact is provided and the part of the second region which lies below the said end, on which part a non-rectifying contact is provided, the other end of the resistance layer being connected by a connection having non-rectifying contacts to a part of the second region which is present below the other end.

Figure 7:
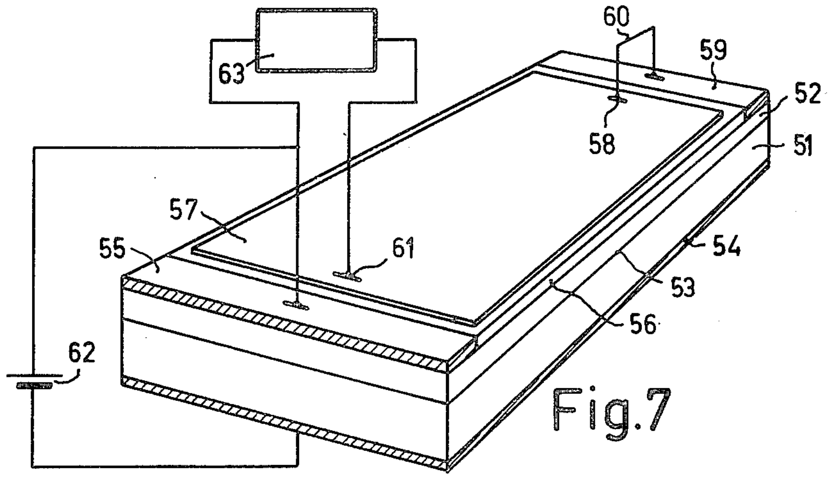
FIG. 7 is a diagrammatic perspective view of a fourth embodiment of a device according to the invention.

As shown in FIG. 7, the device comprises an electroluminescent diode having two regions 51 and 52, a junction 53, contacts 55 and 59 at two ends of the region 52 and a contact 54 throughout the lower surface of the region 51, a dielectric layer 56, and a resistance layer 57 at two ends of which contacts 58 and 61 are provided. The contacts 58 and 59 are connected by a conductor 60. A constant current is supplied by the energy source 59 in the forward direction of the diode. A voltage is supplied by a generator 63 and applied between the contacts 55 and 61. This voltage distributes between the two contacts as a function of the length resistance of the layer 57 and of the region 52. Electric field which influences the possibility of radiation recombinations in said region 52 thus shows in the longitudinal direction a gradient which depends upon said voltage distribution.

An embodiment of a device described with reference to FIG. 6 can be realized by starting from a rectangular gallium arsenide plate, 10 mm long, on which a gallium arsenide phosphide $GaAs_{1-x}P_x$ is deposited by vapor phase epitaxy, wherein $x=0.4$, and which is doped with tellurium with a concentration of $5.10^{16}$ atoms/cm$^3$. The epitaxial deposit has a thickness of 70$\mu$m. A zinc diffusion is carried out in said epitaxial layer in a concentration of $5.10^{18}$ atoms/cm$^3$ down to a depth of 2$\mu$m. A thermal treatment may then be carried out preferably which causes the out-diffusion of zinc, the surface concentration diminishing to approximately $10^{17}$ atoms/cm$^3$.

An insulating silicon oxide layer $SiO_2$ is formed on the surface of the diffused region. This dielectric layer has a thickness of 0.1$\mu$m and the resistivity is in the order of $10^{16}$ to $10^{18}$ ohm.cm. An indium oxide resistance layer $In_2O_3$ is deposited on the preceding one by cathode sputtering in a thickness of 0.1$\mu$m and a resistivity of $10^7$ ohm.cm.

Contacts are provided by depositing gold on the available surfaces of the two regions of the diode in such manner that it can be polarized with a voltage of 1.8 volt in the forward direction. A contact is provided on one end of the resistance layer by depositing gold.

A voltage having a value between 0 and 80 volt which is applied between the points 8 and 9 according to the diagram of FIG. 1 provides a light column whose length varies between the overall length of the diode and a fraction of said length.

The following general considerations apply to the invention. A diode is preferably used of which the first region is of the n-type and the second region is of the p-type and a voltage which produces the electric field is applied in a direction in which electrons, minority charge carriers in the p-region, are attracted towards the surface of said region. The thickness of the second region, the concentration thereof of impurities, the diffusion length of the charge carriers in the material of said region and the characteristics of the dielectric preferably have such values that a clear distinction is obtained along part of the length of the resistance layer, the value of which depends on the applied voltage, between the region of the second region which radiates and the adjacent region which does not.

The thickness of the second region must be small so as to absorb as little as possible of the emitted radiation but should at least be equal to a diffusion length L of the injected minority charge carriers in order that in the absence of the field the recombination probability in the bulk is larger than at the surface. The thickness of the second region is preferably in the order of 1 to 10 L, for example 3 L. This thickness enables a maximum luminous efficiency to be obtained in the part in which the field is low.

The concentration of doping impurities, donor centers or acceptor centers as the case may be, in the second region must be such that in the part which lies below the end of the resistance layer which is set up at a maximum voltage, the electric field penetrates in such manner that it approaches the junction to a distance which is smaller than the diffusion length of the minority charge carriers, for example, is equal to one third of that length. It is known that the depth of penetration of the electric field may be estimated by using a formula such as:

$$W = \left(\frac{2\epsilon V}{qN}\right)^{1/2}$$

which is valid in most of the cases and in which $\epsilon$ is the dielectric constant of the material of the second region, V is the value of the potential difference between said region and the resistance layer in a given point, $q$ is the elementary electricity charge, N is the concentration of impurities. At all the points where the voltage is higher than a given minimum and has the desired direction, the stated condition indicates when a sufficient part of the injected minority charge carriers reaches the zone of the electric field prior to recombination in which they move towards the surface, which involves a minimum light emission.

Both regions of the electroluminescent diode may be manufactured from the same meterial, the p–n junction can be obtained, for example, by the epitaxial deposition on a substrate or by diffusion in a plate of suitable doping means according to known technologies. The so-called III–V compounds which comprise at least one element of column III of the periodic table of elements and at least one element of column V are suitable for this purpose to the extent in which they are luminescent in the visible spectrum.

The junction between the two regions of the diode may also be a hetero junction between two different materials. For example, the first region is of gallium arsenide and the second region is obtained by epitaxially depositing gallium aluminum arsenide.

The minimum geometric dimensions of the device are determined by the visibility to be expected of it. The width of the resistance layer may be very small because the visibility can be improved by means of a system of magnifying lenses, for example, a cylindrical lens having a magnification 2 to 3. The length is determined by the possibilities of the manufacturing methods. The visibility in this direction may also be improved by means of a system of magnifying lenses.

In the various arrangements of the contacts for applying the voltage, the rule for varying the length of the best illuminated part depends as a function of the applied voltage in particular on the shape of the resistance layer and possibly the shape of the second region of the diode.

In one form of the invention the shape of the resistance layer is chosen so that the length of the part complementary to the best illuminated part varies as a function of the applied voltage according to a previously determined rule, for example, a proportionality rule.

The materials used for manufacturing a device are materials which are known in semiconductor technology. The transparent resistance layer is a very thin metal layer or consists of a deposit having regularly divided apertures, for example, in a dense grid configuration in order that the electric field of the other side of the dielectric layer does not show any observable irregularities. The transparent resistance layer may also be manufactured from a transparent material having a high resistivity, such as tin oxide $SnO_2$ or indium oxide $In_2O_3$.

The invention may be used for the manufacture of devices to display an electric quantity in the form of a light column.

What is claimed is:

1. A device comprising an electroluminescent diode having an elongated first region of a first conductivity type, an elongated second region of the opposite conductivity type extending on the first region and forming therewith a P-N junction and showing electroluminescent properties when charge carriers are injected into it, electrode connections to the first and second regions, a thin elongated insulated layer extending on the said second region and over and parallel to said P-N junction, an elongated resistance layer extending on the said insulating layer and over said P-N junction, said resistance layer and said insulating layer being transparent to the radiation emitted from said second region, means connected to the first and second region electrode connections to forward bias the junction causing the injection of charge carriers into the second region along its length whereby said carriers recombine in the second region bulk and radiation is emitted, said means being capable of establishing a column of radiation along the length of the device, and means to establish a potential difference between one end of said resistance layer and said second region and to cause a potential gradient along the length of and in the direction of the other end of said resistance layer, said potential difference being such as to drive the injected carriers in accordance with its magnitude toward the surface of the second region where they tend to recombine in a non-radiative manner thereby reducing the radiation thereat, whereby the length of the radiation column is related to the value of the potential difference.

2. A device as claimed in claim 1 and comprising non-rectifying contacts at the two ends of the resistance layer, and means connecting one of the resistance layer ends to the second region.

3. A device as claimed in claim 1 and comprising a single non-rectifying contact at said one end of the resistance layer, the length resistance of the resistance layer taken between the two ends being significantly higher than the transverse resistance of the insulating layer taken along its thickness.

4. A device as claimed in claim 3, wherein the ratio between the said longitudinal resistance of the resistance layer and the said transverse resistance of the insulating layer is at least equal to 10.

5. A device as claimed in claim 1 and comprising a non-rectifying contact at said one end of said resistance layer and a non-rectifying contact on the part of the second region which is present below the other end of said resistance layer.

6. A device as claimed in claim 1 and comprising a non-rectifying contact at said one end of said resistance layer, a non-rectifying contact on a part of the second region which is present below said one end, and a connection which connects the other end of the resistance layer to the part of the second region which lies below the other end.

7. A device as claimed in claim 1, wherein the ratio between the length and the average width of the resistance layer is at least equal to 10.

8. A device as claimed in claim 7, wherein the first region is of the n- conductivity type and the second region is of the p-conductivity type, the thickness of the second region lying between one and ten times the diffusion length for electrons in the second region.

9. A device as claimed in claim 8, wherein for at least a value of the applied potential difference the distance between the P-N junction and the surface of the second region which lies below said one end of the resistance layer is smaller than the diffusion length for minority carriers in the said second region.

10. A device as claimed in claim 1, wherein the length of the radiation column varies inversely proportionally with the applied potential difference.

11. A device as claimed in claim 1, wherein the first region and the second region are constituted of III-V semiconductor materials, the insulating layer is of silicon oxide, and the resistance layer is of indium oxide.

12. A device as claimed in claim 1, wherein the biasing means comprises a constant current generator.

13. A method of displaying a voltage value comprising providing a device including an electroluminescent diode having an elongated first region of a first conductivity type, an elongated second region of the opposite conductivity type extending on the first region and forming therewith a P-N junction and showing electroluminescent properties when charge carriers are injected into it, electrode connections to the first and second regions, a thin elongated insulated layer extending on the said second region and over and parallel to said P-N junction, and an elongated resistance layer extending on the said insulating layer and over said P-N junction, said resistance layer and said insulating layer being transparent to the radiation emitted from said second region, said diode emitting radiation when charge carriers injected into the second region recombine in the second region bulk, whereas carriers driven toward the surface of the second region tend to recombine in a non-radiative manner, comprising the steps of applying across the first and second region electrodes a constant current voltage which forward biases the P-N junction and causes injection of charge carriers into the second region along the length thereof, said voltage being such as to cause the said length of the second region to become luminous, and applying between one end of said resistance layer and the second region a signal voltage causing a potential gradient in the resistance layer and a field in the second region which in accordance with its value attracts the injected charge carriers toward the surface whereat they tend to undergo non-radiative recombination whereby the end of the second region reduces in luminosity, the total luminous length thus being inversely related to the signal voltage magnitude.

* * * * *